US008786284B2

(12) United States Patent
Sirigiri et al.

(10) Patent No.: US 8,786,284 B2
(45) Date of Patent: Jul. 22, 2014

(54) INTEGRATED HIGH-FREQUENCY GENERATOR SYSTEM UTILIZING THE MAGNETIC FIELD OF THE TARGET APPLICATION

(75) Inventors: Jagadishwar R. Sirigiri, Natick, MA (US); Thorsten Maly, Somerville, MA (US)

(73) Assignee: Bridge12 Technologies, Inc., Framingham, MA (US)

( * ) Notice: Subject to any disclaimer, the term of this patent is extended or adjusted under 35 U.S.C. 154(b) by 652 days.

(21) Appl. No.: 12/930,584

(22) Filed: Jan. 11, 2011

(65) Prior Publication Data
US 2012/0176133 A1  Jul. 12, 2012

(51) Int. Cl.
*G01V 3/00* (2006.01)
*G01R 33/28* (2006.01)
*H01J 25/02* (2006.01)
*G01R 33/3815* (2006.01)

(52) U.S. Cl.
CPC .......... *G01R 33/282* (2013.01); *G01R 33/3815* (2013.01); *H01J 25/025* (2013.01)
USPC .......................................... 324/318; 324/322

(58) Field of Classification Search
USPC ........................ 324/318, 322, 316, 307, 309
See application file for complete search history.

(56) References Cited

U.S. PATENT DOCUMENTS

| 4,480,234 | A | 10/1984 | Wachtel |
| 6,064,917 | A | 5/2000 | Matson |
| 6,374,132 | B1 | 4/2002 | Acker et al. |
| 6,515,260 | B1 * | 2/2003 | Anderson ................ 219/385 |
| 7,163,655 | B2 | 1/2007 | Weber et al. |
| 7,205,764 | B1 * | 4/2007 | Anderson et al. ............. 324/307 |
| 7,292,035 | B2 * | 11/2007 | Habara et al. ................ 324/316 |
| 7,646,200 | B2 | 1/2010 | Slade et al. |
| 7,649,355 | B2 | 1/2010 | Strange et al. |
| 2004/0124839 | A1 | 7/2004 | Kakugawa et al. |
| 2010/0090601 | A1 | 4/2010 | Eisen et al. |

OTHER PUBLICATIONS

Written Opinion of the International Searching Authority for International Application No. PCT/US2011/002011, six (6) pages, unnumbered.

(Continued)

*Primary Examiner* — Louis Arana
(74) *Attorney, Agent, or Firm* — Iandiorio Teska & Coleman, LLP (57) ABSTRACT

An integrated high-frequency generator system utilizing the magnetic field of the target application including a magnetic resonance magnet having an application zone and a high-frequency (microwave/terahertz) generator zone in the magnetic field of the magnetic resonance magnet; and a high-frequency (microwave/terahertz) generator disposed in the high-frequency (microwave/terahertz) generator zone and utilizing the magnet field of the magnetic resonance magnet to generate the high-frequency (microwave/terahertz) radiation. The magnetic resonance magnet may have an auxiliary magnetic field source for modifying the magnetic field profile in the high-frequency (microwave/terahertz) generator zone. The high-frequency (microwave/terahertz) generator may include an electron gun for generating an electron beam adapted to be focused by a magnetic field source having a spatially rising region, a homogenous region and a decaying region, an interaction structure for generating high-frequency (microwave/terahertz) radiation, an internal mode converter in the homogenous region for extracting the high-frequency (microwave/terahertz) radiation through a window, and a reduced collector disposed substantially in the homogenous region before the electron beam spreads in the decaying region.

25 Claims, 11 Drawing Sheets

(56) References Cited

OTHER PUBLICATIONS

J.L. Doane, "Propagation and mode coupling in corrugated and smooth-walled circular waveguides", *Infrared and Millimeter Waves*, vol. 13, Millimeter Components and Techniques, Part IV, Ed. Kenneth J. Button, 1985, 49 pgs.

Abrams, R.H., et al., "Vacuum Electronics for the $21^{st}$ Century", IEEE Microwave Magazine, Sep. 2001, pp. 61-72.

Qiu, J.X., et al., "Vacuum Tube Amplifiers", IEEE Microwave Magazine, Dec. 2009, pp. 38-51.

Felch, K.L., et al., "Characteristics and Applications of Fast-Wave Gyrodevices", Proc. IEEE, May 1999, 87(5), pp. 752-781.

Maly, T., et al., "Dynamic Nuclear Polarization at High Magnetic Fields", J. Chem. Phys., 2008, 128(5), pp. 052211-052219.

Barnes, A.B., et al., "High-Field Dynamic Nuclear Polarization for Solid and Solution Biological NMR", Appl. Magn. Reson., 2008, 24(3), pp. 237-263.

Goertz, S.T., "The Dynamic Nuclear Polarization Process", Nucl. Instrum. & Methods in Phys. Res., Sect. A, 2004, 526, pp. 28-42.

Crabb, D.G. and W. Meyer, "Solid Polarized Targets for Nuclear and Particle Physics Experiments", Annual Review of Nuclear and Particle Science, 1997, 47(1), pp. 67-109.

van den Brandt, B., et al., "Dynamic Nuclear Polarization—from Polarized Targets to Metabolic Imaging", Appl. Magn. Reson., 2008, 34(3), pp. 475-481.

Bajaj, V.S., et al., "DNP Enhanced Frequency-Selective TEDOR Experiments in Bacteriorhodopsin", J. Magn. Reson., 2010, 202(1), pp. 9-13.

Gallagher, F.A., et al., "Magnetic resonance imaging of pH in vivo using hyperpolarized $^{13}$C-labelled bicarbonate", Nature, Jun. 2008, 453(7197), pp. 940-943.

Adams, R.W., et al., "Reversible Interactions with para-Hydrogen Enhance NMR Sensitivity by Polarization Transfer", Science, 2009, 323(5922), pp. 1708-1711.

Navon, G., et al., "Enhancement of Solution NMR and MRI with Laser-Polarized Xenon", Science, Mar. 29, 1996, 271(5257), pp. 1848-1851.

Bifone, A., et al., "NMR of Laser-Polarized Xenon in Human Blood", Proc. Natl. Acad. Sci. USA, Nov. 1996, 93(23), pp. 12932-12936.

Cherubini, A., et al., "Hyperpolarising $^{13}$C for NMR Studies Using Laser-Polarised $^{129}$Xe: SPINOE vs. Thermal Mixing", Chem. Phys. Lett., 2003, 371(5-6), pp. 640-644.

Pavlovskaya, G.E. et al., "Hyperpolarized Krypton-83 as a Contrast Agent for Magnetic Resonance Imaging", Proceedings of the National Academy of Sciences of the United States of America, Dec. 20, 2005, 102(51), pp. 18275-18279.

Goto, A., et al., "Optical Pumping NMR in the Compensated Semiconductor InP:Fe", Physical Review B, 2004, 69(7), p. 075215.

Carver, T.R. and C.P. Slichter, "Experimental Verification of the Overhauser Nuclear Polarization Effect", Physical Review, May 15, 1956, 102(4), pp. 975-980.

Carver, T.R. and C.P. Slichter, "Polarization of Nuclear Spins in Metals", Physical Review, 1953, 92(1), pp. 212-213.

Abragam, A and M. Goldman, "Principles of Dynamic Nuclear Polarisation", Rep. Prog. Phys., 1978, 41(3), pp. 395-467.

Hall, D., et al., "Polarization-Enhanced NMR Spectroscopy of Biomolecules in Frozen Solution", Science, May 9, 1997, 276(5314), pp. 930-932.

Song, C., et al., "TOTAPOL: A Biradical Polarizing Agent for Dynamic Nuclear Polarization Experiments in Aqueous Media", J. Am. Chem. Soc., 2006, 128(35), pp. 11385-11390.

Matsuki, Y., et al., "Dynamic Nuclear Polarization With a Rigid Biradical Angew", Chem. Int. Ed., 2009, 48, pp. 4996-5000.

Dane, E.L., et al., "Synthesis of a BDPA-TEMPO Biradical", Organic Letters, 2009, 11(9), pp. 1871-1874.

Hu, K.-N., et al., "High-Frequency Dynamic Nuclear Polarization Using Biradicals: A Multifrequency EPR Lineshape Analysis", J. Chem. Phys., 2008, 128(5), pp. 052302-052317.

Wollan, D.S., "Dynamic Nuclear Polarization With an Inhomogeneously Broadened ESR Line 1." Theory. Phys. Rev. B, May 1, 1976, 13, p. 3671-3685.

Wollan, D.S., "Dynamic Nuclear Polarization With an Inhomogeneously Broadened ESR Line 11." Experiment. Phys. Rev. B, May 1, 1976, 13(9), p. 3686-3696.

Bloembergen, N., "On the Interaction of Nuclear Spins in a Crystalline Lattice", Physica, May 1949, 15(3-4), pp. 386-426.

Becerra, L., et al., "Dynamic Nuclear Polarization With a Cyclotron Resonance Maser at 5 T", Phys. Rev. Lett., Nov. 22, 1993, 71(21), pp. 3561-3564.

Bajaj, V.S., et al., "250 GHz CW Gyrotron Oscillator for Dynamic Nuclear Polarization in Biological Solid State NMR", J. Magn. Reson., 2007, 190, pp. 86-114.

Han, S.-T., et al., "Spectral Characteristics of a 140-GHz Long-Pulsed Gyrotron", IEEE Transactions on Plasma Science, Jun. 2007, 35(3), pp. 559-564.

Torrezan, A.C., et al., "Continuous-Wave Operation of a Frequency-Tunable 460-GHz Second-Harmonic Gyrotron for Enhanced Nuclear Magnetic Resonance", IEEE Transactions on Plasma Science, Jun. 2010, 38(6), pp. 1150-1159.

Barnes, A., et al., "Cryogenic Sample Exchange NMR Probe for Magic Angle Spinning Dynamic Nuclear Polarization", J. Magn. Reson., 2009, 198, pp. 261-270.

Barnes, A., et al., "Resolution and Polarization Distribution in Cryogenic DNP/MAS Experiments", Phys. Chem. Chem. Phys., 2010, 12(22), pp. 5861-5867.

V. L. Bratman et al., THz Gyrotron and BWO Designed for Operation in DNP-NMR Spectrometer Magnet, Journel of Infrared Millimeter and Terahertz Waves, 2013 (ten (10) pages).

V. L. Bratman, et al., Development of Sub-THz and THz Electron Devices at the Institute of Applied Physics, $2^{nd}$ Dynamic Nuclear Polarization Symposium, Königstein, Germany, Sep. 2-4, 2009 (four (4) pages).

* cited by examiner

INTEGRATED HIGH-FREQUENCY GENERATOR SYSTEM UTILIZING THE MAGNETIC FIELD OF THE TARGET APPLICATION

FIELD OF THE INVENTION

This invention relates to an integrated high-frequency generator system utilizing the magnetic field of the target application and in one embodiment to such adapted for use in magnetic resonance systems such as a nuclear magnetic resonance (NMR) or magnetic resonance imaging (MRI) system with dynamic nuclear polarization (DNP), or an electron paramagnetic/spin resonance (EPR/ESR) system.

BACKGROUND OF THE INVENTION

Microwave and terahertz radiation can be generated either by a solid-state device based on semiconductors, a vacuum electron device (VED) based on the interaction between an electron beam and an electromagnetic circuit or by photonics based sources such as lasers. In the millimeter wave (30-300 GHz) regime VED based sources are dominant because of their high power, wide bandwidth, efficiency and robustness when compared to solid-state and photonics based devices. The aforementioned advantages of VEDs are also valid in the terahertz (300 GHz-3 THz) regime especially, between 300 GHz-1 THz. In this part of the electromagnetic spectrum VED based devices can provide 3 to 4 orders of magnitude higher peak and average power than solid-state devices and are significantly compact and approximately an order of magnitude more efficient than photonics based devices.

The applications of millimeter waves in the area of defense, communication, industrial processing and scientific applications are very well known. Recently, the advent of various kinds of terahertz sources has sparked considerable interest in applications of terahertz sources in the above applications and notably in the area of medical imaging, therapy and other biotechnological applications.

The art of generating microwave and millimeter wave frequencies using an electron beam coupled to an electromagnetic structure (circuit) is well known. A VED is a vacuum tube that has the following main components in a vacuum envelope. An electron gun which generates the electron beam either by thermionic emission from a metal such as tungsten impregnated with other metals and compounds or by field emission. The electron beam, which is used as a means to transform the DC energy provided by a high voltage power supply to microwave or terahertz radiation in the circuit. The electron beam gains kinetic energy from the high voltage power supply and it transfers this kinetic energy to the microwave/terahertz waves in the interaction structure. The magnetic system is used to focus and transport the electron beam from the electron gun to the interaction region where microwaves are generated or amplified. In some classes of VEDs like gyrotrons, the magnetic system also plays a role in the interaction between the electron beam and the circuit. In almost all VEDs, strong magnetic fields are necessary to focus the beam by overcoming the space forces inherent in the electron beam. In gyrotrons the required magnetic field is directly proportional to the cyclotron frequency of the electron beam, which is critical for its interaction with the electromagnetic structure. The gyrotron can be operated either at the fundamental mode or higher harmonics of the cyclotron frequency. Higher harmonics have the advantage that a lower magnetic field for operation is required, depending on the harmonic number. The conversion of the kinetic energy in the electron beam to microwave or terahertz waves takes place in the interaction structure. The resonant frequency of the structure is tuned to interact with the electron beam at a specific frequency or a range of frequencies. The interaction structure is also referred to as cavity or a resonator. The interaction structure operates in either the fundamental or a higher order Transverse Electric (TE) or a Transverse Magnetic (TM) mode. Such a mode cannot be efficiently extracted out of the microwave tube or transported over long distances at low loss. Hence, an internal mode converter is often employed to transform the operating mode to a different mode, typically, a free space Gaussian-like mode. The internal mode converter can be designed on the basis of standard waveguide design techniques or quasioptical methods. The body of the VED is held at high vacuum. The window allows the microwaves or terahertz radiation generated in the VED to be extracted out of the tube. The spent electron beam after giving some of its energy to the microwave or terahertz fields continues traveling to the anode and is typically collected on a copper structure called the collector. The collector is either air- or water-cooled to absorb the remaining energy of the spent beam, which is dissipated as heat in the collector. For devices based on fast-wave interaction between the electron beam and the electromagnetic circuit such as gyrotrons, at least 0.036 Tesla/GHz of magnetic field is required for fundamental electron cyclotron operation. At microwave and terahertz frequencies several Tesla (T) of magnetic field is necessary. This magnetic field is typically provided by a superconducting magnet which is large and expensive.

Terahertz radiation is used in many fields of magnetic resonance spectroscopy for example in electron paramagnetic/spin resonance (EPR/ESR) spectroscopy. In EPR Spectroscopy, paramagnetic systems are studied by their microwave absorption in a strong magnetic field. At high magnetic fields solid-state sources deliver very little power and high-power microwave sources are desired. Dynamic Nuclear Polarization (DNP) is a technique that utilizes the large Boltzmann polarization of the electron spin reservoir to provide a boost in NMR signal intensities by several orders of magnitude, thus dramatically increasing the data acquisition rate in a NMR experiment. This makes DNP a valuable method to overcome the intrinsic low sensitivity of liquid- and solid-state NMR experiments and the method is of significant interest in applications ranging from particle physics to structural biology. In clinical imaging, this method can be especially valuable in improving contrast and resolution in Magnetic Resonance Imaging (MRI). Several other techniques are available to increase the signal intensity in an NMR experiment, such as para-hydrogen induced polarization (PHIP), polarization of noble gases such as Helium, Xenon or Krypton and optically pumped nuclear polarization of semiconductors. However, especially in the area of structure determination of bio-macromolecules or bio-solids, microwave driven DNP-enhanced NMR spectroscopy seems to be the most versatile method.

DNP is not a new scientific area but is currently experiencing a renaissance with the advent of high-power microwave and terahertz sources. The first DNP experiments were performed in the early 1950s at low magnetic fields but until recently, the technique was of limited applicability because of the lack of high-frequency, high-power terahertz sources. In a DNP experiment, the large electron polarization of a polarizing agent is transferred to surrounding nuclei (typically protons, $^1$H) by terahertz (microwave) irradiation on-resonance with an EPR transition. The electron spin system required for DNP can either be an endogenous or exogenous paramagnetic system. To date most polarizing agents for high-field DNP experiments are based on TEMPO (2,2,6,6-tetramethylpiperidin-1-oxyl) moieties, which employ the cross-effect (CE) as the DNP mechanism. The CE mechanisms can be exploited, if the homogenous linewidth ($\delta$) and the inhomogeneous breadth ($\Delta$) of the EPR spectrum of the paramagnetic polarizing agent, is larger compared to nuclear Larmor frequency ($\omega_{01}$). The underlying mechanism is a two-step process involving two electrons with Larmor frequencies $\omega_{0S1}$ and $\omega_{0S2}$ separated by the $\omega_{01}$ (matching condition). The DNP-enhanced nuclear polarization then disperses throughout the bulk via spin diffusion.

Four components are essential to perform DNP-enhanced NMR spectroscopy: A high-power, high-frequency terahertz source; a low-loss transmission line; a NMR probe, that allows simultaneous terahertz and radio-frequency irradiation of the sample and a polarizing agent as the source of the high thermal electron polarization (briefly described above).

The efficiency of a DNP experiment depends strongly on the magnetic field ($B_1$) at the sample, which is induced by the terahertz irradiation. The strength of this field, $B_1$ is proportional to $\sqrt{PQ}$ with P, the microwave power and Q, the quality factor of the cavity. Typically, DNP experiments are performed without a resonant structure (cavity) thus, the quality factor Q is small (<5). To create sufficiently strong $B_1$ fields high-power terahertz sources such as gyrotrons are required.

In current DNP setups, the microwave/terahertz source is completely independent from the magnetic resonance system and requires an additional superconducting magnet or a conventional high-field electromagnet or a permanent magnet system. The microwave/terahertz radiation is delivered to the sample using a transmission line. Often the main magnet and the superconducting gyrotron magnet have to be separated sufficiently to avoid any interference. Throughout this background and the rest of the disclosure magnetic resonance system is meant to include all such devices e.g. nuclear magnetic resonance (NMR), electron paramagnetic, resonance (EPR), magnetic resonance imaging (MRI) . . . .

Low-loss microwave/terahertz transmission lines are required to efficiently deliver the terahertz radiation from the source (e.g. gyrotron) to the sample. To ensure minimal transmission losses a corrugated metallic waveguide can be used. Operation in the $HE_{11}$ mode of a corrugated metallic waveguide results in negligible ohmic losses thus enabling high efficiency transmission over long distances. A quasi-$HE_{11}$ mode can be generated inside the VED using an internal mode converter and the radiation can be directly coupled to the transmission line. Furthermore, in a solid-state DNP experiment the $HE_{11}$ mode can be used to directly illuminate the sample. For DNP-enhanced solid-state NMR experiments a low-temperature, magic-angle-spinning (MAS) NMR probe is required. Cryogenic temperatures are achieved by either using cold nitrogen as the bearing and turbine gas or by using a separated variable-temperature line for sample cooling. Temperatures down to 85 K can be reached using this approach. If lower temperatures are necessary cold He gas, as blow-off gas directly from a liquid He Dewar can be used for cooling. To maintain the possibility to tune the radiofrequency (RF) circuit even at low temperatures a transmission line circuit is typically employed. Here all variable tuning elements are located outside the probe at room temperature. The terahertz radiation can be introduced either along the rotor axis or perpendicular. In the later case, the radiation enters the sample through diffraction between the turns of the RF coil. In such setup, due to the sample rotation a majority of the sample is uniformly exposed to the terahertz radiation, thus increasing the efficiency of the DNP process. To change samples without removing the probe from the magnet, a sample eject system can be added to the probe.

There are a number of shortcomings to the conventional approaches. Both magnets, used to perform the magnetic resonance experiments (main magnet) and the magnet for the microwave generator are large and expensive and each requires cryogenic cooling. A microwave waveguide is necessary to deliver the terahertz energy from the microwave generator to the sample area located in the main magnet and it must be of sufficient length to accommodate adequate distance between the main magnet and the microwave generator magnet to prevent field interference. Substantial beam power in the gyrotron (e.g. >2 kW) is required and the conversion is relatively inefficient especially in the second harmonic operation: the microwave output is only 10-20 watts.

SUMMARY OF THE INVENTION

It is an object of this invention to provide an integrated high-frequency generator system utilizing the magnetic field of the target application.

It is a further object of this invention to provide such a system for use in magnetic resonance system.

It is a further object of this invention to provide an improved magnetic resonance device and microwave generator adapted for use in such a magnetic resonance system.

It is a further object of this invention to provide such an improved magnetic resonance device and high-frequency (microwave/Terahertz) generator adapted for use with DNP.

It is a further object of this invention to provide such a magnetic resonance device, which is easily and simply adapted for DNP operation.

It is a further object of this invention to provide such a high-frequency generator which is smaller, more compact and more efficient.

The invention results from the realization that an improved, integrated high-frequency generator system utilizing the magnetic field of the target application which reduces the number and cost of magnets, the size or footprint of the overall system, shortens or eliminates the microwave waveguide, reduces the necessary power, increases efficiency and reduces the size of the collector and overall size of the, VED, high-frequency generator can be achieved with a main magnet, which has both an application zone and a microwave generator zone utilizing the magnetic field of the main magnet.

The subject invention, however, in other embodiments, need not achieve all these objectives and the claims hereof should not be limited to structures or methods capable of achieving these objectives.

This invention features an integrated high-frequency generator system utilizing the magnetic field of the target application including a magnetic resonance magnet having an application zone and a high-frequency (microwave/terahertz) generator zone in the magnetic field of the magnetic resonance magnet, and a high-frequency (microwave/terahertz) generator disposed in the high-frequency (microwave/terahertz) generator zone and utilizing the magnet field of the magnetic resonance magnet to generate the high-frequency (microwave/terahertz) radiation.

In preferred embodiments the high-frequency (microwave/terahertz) generator zone may be in the main magnetic field of the magnetic resonance magnet. The high-frequency (microwave/terahertz) generator zone may be in the fringe magnetic field of the magnetic resonance magnet. There may be an auxiliary magnetic field source for modifying the magnetic field profile in the high-frequency (microwave/terahertz) generator zone. The auxiliary magnetic field source may include a winding mounted on the high-frequency (microwave/terahertz) generator. The auxiliary magnetic field source may include a winding mounted in the magnetic resonance magnet. The auxiliary magnetic field source may be comprised of at least one permanent magnet. The auxiliary magnetic field source may include a modification in the magnetic resonance magnet. The magnet resonance magnet may include at least one winding and the modification may include a variation in the amp-turns of a winding of the magnetic resonance magnet. There may be further included a high-frequency (microwave/terahertz) transmission line extending from the high-frequency (microwave/terahertz) generator to the application zone. The high-frequency (microwave/terahertz) radiation may be used to perform DNP. The auxiliary magnetic field source modifies the value of the magnetic field profile in the high-frequency (microwave/terahertz) generator zone to synchronize high-frequency (microwave/terahertz) radiation from the high-frequency (microwave/terahertz) generator to enable the DNP process in the application zone. The high-frequency (microwave/terahertz) generator may utilize the magnetic field of the magnetic resonance system for at least one of focusing, transportation of the electron beam and interaction between the electron beam and the circuit of the VED. The high-frequency (microwave/terahertz) resonance magnet may include a bore and the high-frequency (microwave/terahertz) generator zone may be in the bore.

This invention also features a magnetic resonance magnet device including a magnetic resonance magnet having an application zone and a high-frequency (microwave/terahertz) generator zone in the magnetic field of the magnetic resonance magnet and an auxiliary magnetic field source for modifying the magnetic field profile in the high-frequency (microwave/terahertz) generator zone.

In preferred embodiments the high-frequency (microwave/terahertz) generator zone may be in the main magnetic field of the magnetic resonance magnet. The high-frequency (microwave/terahertz) generator zone may be in the fringe magnetic field of the magnetic resonance magnet. There may be further included an auxiliary magnetic field source for modifying the magnetic field profile in the high-frequency (microwave/terahertz) generator zone. The auxiliary magnetic field source may include a winding mounted in the magnetic resonance magnet. The auxiliary magnetic field source may include a modification in the magnetic resonance magnet. The magnet resonance magnet may include at least one winding and the modification may include a variation in the amp-turns of a winding of the magnetic resonance magnet. There may be further included a microwave transmission line extending from the microwave generator to the application zone. The high-frequency (microwave/terahertz) radiation may be used to perform DNP. The auxiliary magnetic field source may increase the magnitude of the magnetic field profile in the high-frequency (microwave/terahertz) generator zone to synchronize high-frequency (microwave/terahertz) radiation from the microwave generator to enable the DNP process in the application zone. The microwave generator may utilize the magnetic field of the magnetic resonance system for at least one of focusing, transportation of the electron beam and interaction between the electron beam and the circuit of the VED. The magnetic resonance magnet may include a bore and the high-frequency (microwave/terahertz) generator zone may be in the bore.

The invention also features a high-frequency (microwave/terahertz) generator including an electron gun for generating an electron beam adapted to be focused by a magnetic field source having a spatially rising region, a homogenous region and a decaying region, an interaction structure for generating high-frequency (microwave/terahertz) radiation, an internal mode converter in the homogenous region for extracting the high-frequency (microwave/terahertz) radiation through a window, and a reduced collector disposed substantially in the homogenous region before the electron beam spreads in the decaying region.

In preferred embodiments there may further be a magnetic field source proximate the interaction structure and internal mode converter. The internal mode converter may include a high-frequency (microwave/terahertz) reflector generally parallel to the beam and directing the beam directly out the window.

BRIEF DESCRIPTION OF THE SEVERAL VIEWS OF THE DRAWINGS

Other objects, features and advantages will occur to those skilled in the art from the following description of a preferred embodiment and the accompanying drawings, in which.

DETAILED DESCRIPTION OF THE INVENTION

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

This invention has broad application but evolved in the specific area of DNP-enhanced magnetic resonance spectroscopy and so the disclosure herein uses that exemplar. Throughout this application including the specification and claims the use of "magnetic resonance system" includes all of such apparatus e.g. NMR, MRI, EPR/ESR . . . and the use of gyrotrons is specific only to the embodiment shown herein but is representative of all VED's e.g. gyrotrons, klystrons, traveling wave tubes (TWTs), gyrotron traveling wave tube amplifier (gyro-TWT), gyro-twystrons, gyroklystrons or any combinations of such devices. DNP-enhanced NMR spectroscopy requires a high-power microwave/terahertz source, having an operating frequency that is directly correlated to the NMR frequency ($v_{DNP} \approx 660 * v_{NMR}$). For example, for DNP-enhanced NMR spectroscopy at 600 MHz ($^1$H Larmor frequency) a 14.1 T NMR magnet is required, and the operating frequency of the microwave/terahertz source has to be 395 GHz. A gyrotron is capable of generating sufficient continuous wave power necessary for DNP at such frequencies.

The gyrotron is a mildly relativistic device, hence, for generating radiation at the electron resonance frequency corresponding to the field of the NMR magnet, the gyrotron requires a magnetic field which is up-shifted approximately by the relativistic mass factor of the electrons in the gyrotron. This up-shift corresponds to the operating voltage of the gyrotron and is actually the relativistic mass factor g, which can be expressed as g=1+Voltage (in kV)/511. To generate 395 GHz as mentioned in the example above a gyrotron operating at 15 kV requires a magnetic field of ~14.52 T (=14.1*(1+15/511)) which is about 0.42 T higher than the 14.1 T field provided by the 600 MHz NMR magnet.

Unfortunately, superconducting magnets at fields above 10 T require the use of niobium-tin ($Nb_3Sn$) superconducting material which is expensive. The alternate approach is to use second harmonic operation (frequency doubling) in which the gyrotron operates at the second cyclotron harmonic. In such a system, the gyrotron requires only half of the magnetic field value as in the case of fundamental mode operation described above. This allows the use of 7.26 (=14.52/2) T magnet. Such a magnet can be built of cheaper superconducting material such as niobium-titanium ($Nb_3Ti$) and would only cost approximately half of the price compared to a $Nb_3Sn$ magnet.

However, operating the gyrotron in the $2^{nd}$ harmonic has a number of disadvantages. Firstly, the threshold current for oscillations is much higher thus requiring a higher operating voltage and current and resulting in higher electron beam power. Secondly, operation in the $2^{nd}$ cyclotron harmonic is very susceptible to competition from the fundamental mode interaction. This limits the operating parameter space of the $2^{nd}$ harmonic generation and often contamination of the output radiation with terahertz radiation at the fundamental cyclotron harmonic. Thirdly, the efficiency of the $2^{nd}$ harmonic interaction is significantly lower than the fundamental mode interaction. To partly compensate for this, the device is usually operated at higher voltage and current which requires a large water cooled collector to handle the high electron beam power. In spite of the above challenges, $2^{nd}$ harmonic gyrotrons are used in DNP application because of the prohibitive cost of gyrotron magnets for NMR frequencies >400 MHz. For a 400 MHz system the necessary 263.6 GHz radiation can be generated at fundamental mode operation using a 9.6 T NbTi magnet.

Figure 1:
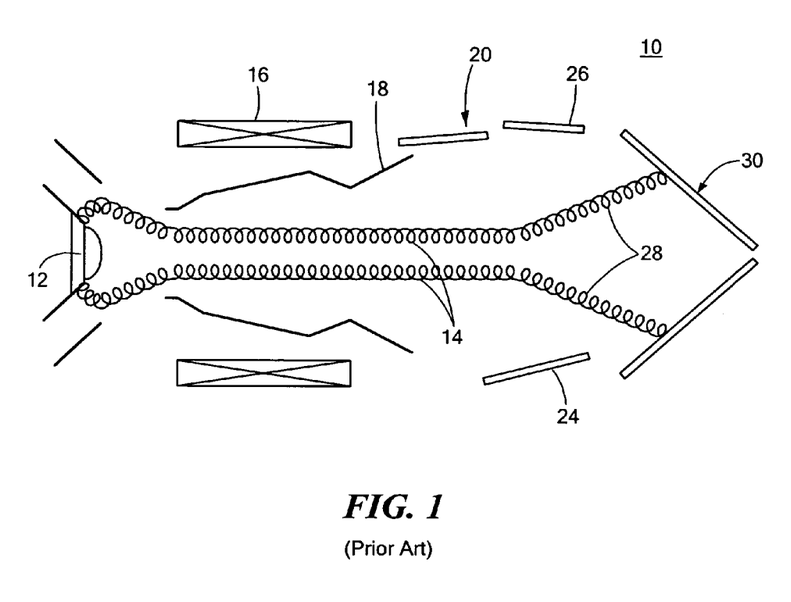
FIG. 1 is a schematic diagrammatic view of a prior art vacuum electron device (VED) for microwave generation.

There is shown in FIG. 1 a vacuum electric device (VED) such as a gyrotron 10. It includes an electron gun 12 which generates an electron beam 14 which is focused and transported by the magnetic field provided by the magnetic system 16. The terahertz radiation is generated in the interaction structure or cavity 18 and are received by internal mode converter 20 which includes a number of microwave reflective surfaces, which in this case are represented by microwave reflectors or mirrors 22 and 24. The microwaves are reflected off mirror 22 then to mirror 24 from whence they are incident on window 26 where they exit the system. The high power electron beam spreads as shown at 28 when the magnetic field generated by magnetic system 16 decays. This spreading significantly reduces the power density of the beam where it is captured by collector 30.

Figure 2:
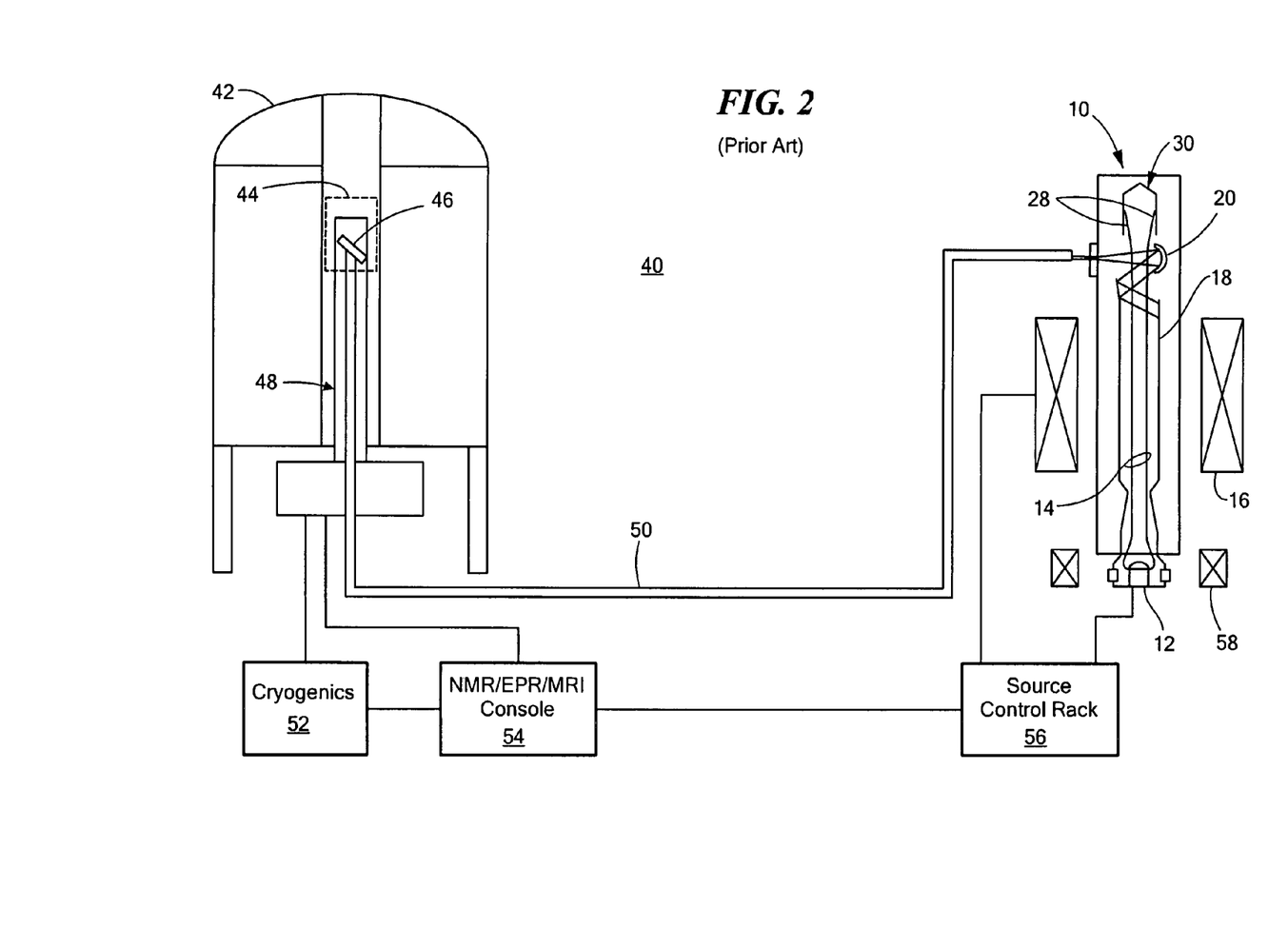
FIG. 2 is a schematic diagrammatic view of a prior art magnetic resonance system e.g. NMR or MRI with DNP capability.

Such VEDs are used in a conventional magnetic resonance systems 40, FIG. 2, which includes a high field cryogenically cooled magnet 42 which has an application zone 44 in which is located the magnetic resonance sample 46. Sample 46 is held in position by probe 48 which functions in the normal way to hold the sample, direct the microwave and RF radiation and control and sense the ambient conditions and record the response of the sample to the applied stimuli. High-frequency radiation is generated in microwave generator 10 are delivered in a microwave wave guide 50 to the application zone, which in this embodiment is application zone 44 of magnet device 42. Cryogenics system and controls 52 maintains the super cooling of magnet probe device 48. Console 54 controls the creation of the RF pulses, frequency, shape, duration and controls operations in magnetic resonance spectroscopy. Source control rack 56 controls the magnitude and shape of the current and voltage to magnetic system 16 and electron gun 12. Electron gun trim coil 58 is representative of the fact that there may be one or more coils in addition to the magnetic system coil 16 to operate and condition the electron beam.

Figure 3:
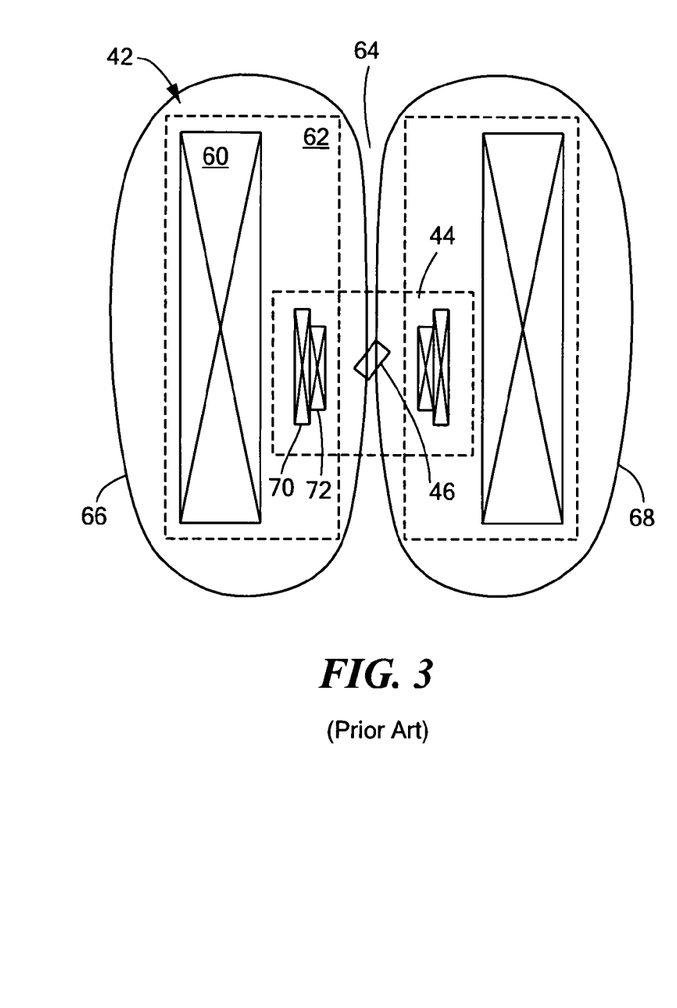
FIG. 3 is a schematic diagrammatic sectional view of a prior art magnet device for a magnetic resonance system having a single, sample, zone.

Magnetic resonance magnet device 42, FIG. 3, may also be powered by magnetic coil 60 mounted on a ferromagnetic or an air core 62. Application zone 44 is then located in the bore 64 in the main field of the magnet depicted by the field lines 66 and 68. The main windings 60 may be aided by one or more shim coils 70, 72.

Figure 4:
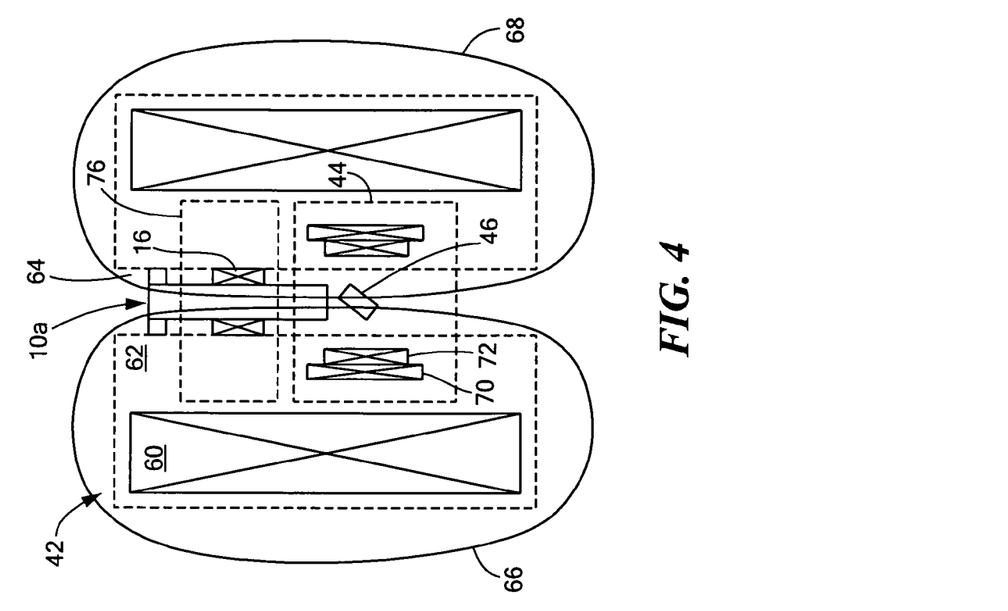
FIGS. 4-6 are schematic diagrammatic views similar to FIG. 3 of a magnetic resonance magnet device according to this invention showing various placements of the auxiliary magnetic field source and having both an application zone and a microwave generator zone.

In accordance with one embodiment of this invention, FIG. 4, the high-frequency generator or terahertz source 10a along with its magnetic system coils 16 is located in the main field in the microwave generator zone 76 in bore 64 of magnet 42. High-frequency generator 10a is similar to high-frequency generator 10 of FIG. 1 but modified according to this invention.

Figure 5:
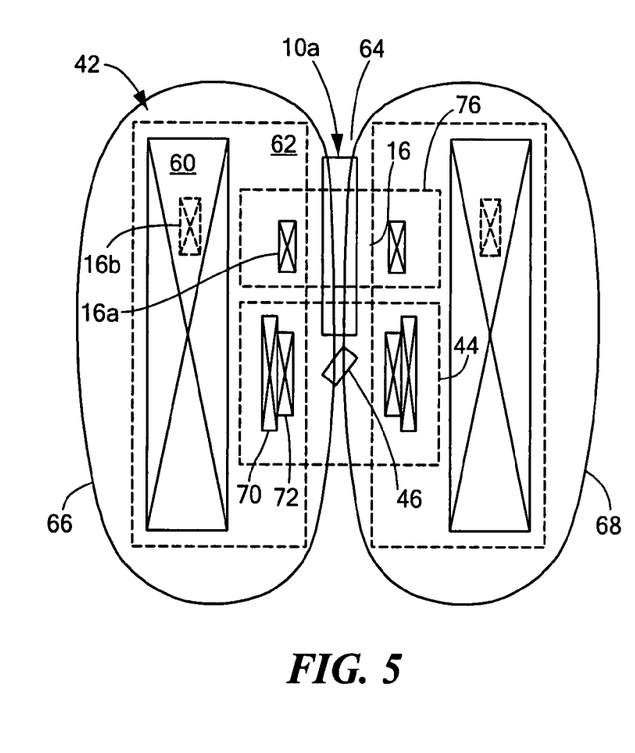
Figure 6:
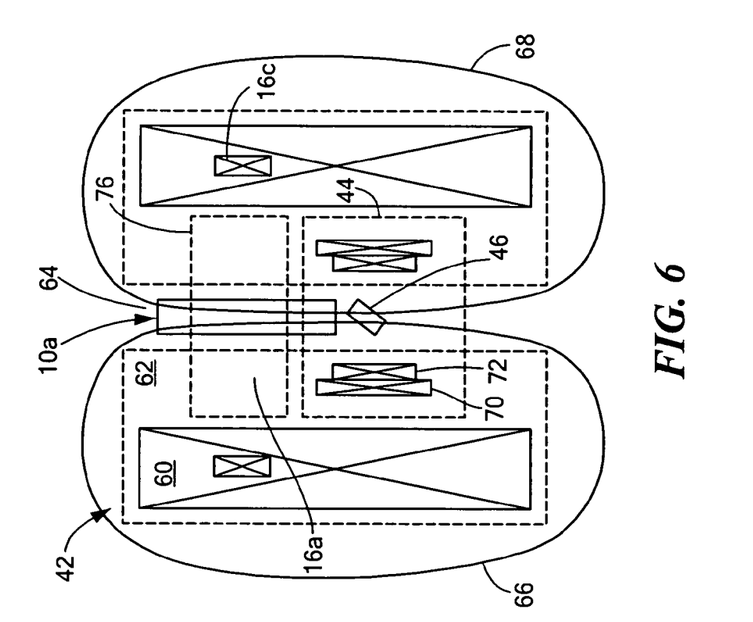
Figure 7:
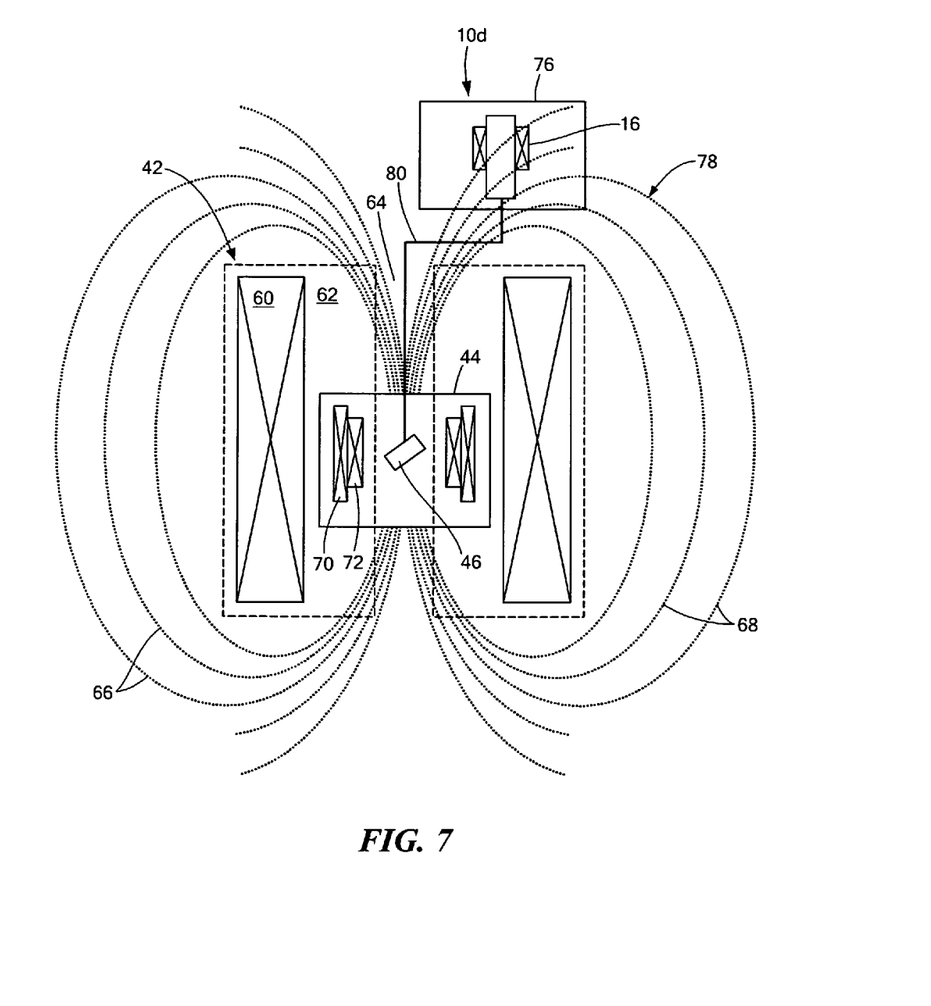
FIG. 7 is a schematic diagrammatic sectional view similar to FIG. 3 illustrating the microwave generator zone in the fringe field of the magnetic resonance magnet device.

Alternatively, FIG. 5, the magnetic system associated with the high-frequency generator 10a may be located in the core as indicated at 16a or actually in the coil as indicated at 16b. Further, alternatively, the auxiliary magnetic field source 16 may be implemented not by a separate coil but by a variation in the amp-turn windings 16c, FIG. 6 of the main magnet coil 42. While the microwave generator zone 76 is located in the highly concentrated area of the main field in bore 64 as shown in FIGS. 4, 5 and 6, this is not a necessary limitation of the invention as it may be in the fringe area 78 of the main field as shown in FIG. 7. There the high-frequency generator 10 in microwave generator zone 76 is located in the fringe are 78 of the main field. In that case a short length of microwave wave guide 80 is used to deliver the microwave radiation from source 10 to sample 46. The auxiliary magnetic field sources 16, a, b, c, may be a trim coil or buck or boost coil. Alternatively, it and other of the coils may be permanent magnets either ferromagnetic or ceramic magnets if desired.

Figure 8:
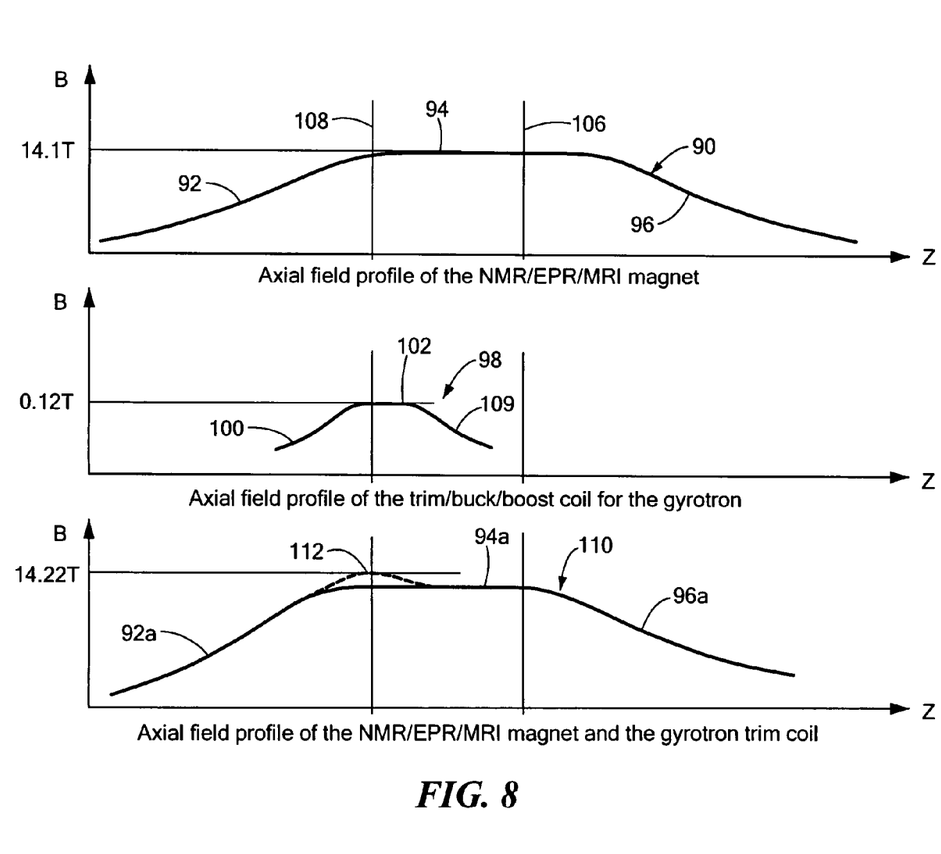
FIG. 8 illustrates a spatial field profile of the magnetic resonance magnet, auxiliary magnetic field source and the resulting composite field.

In FIG. 8 a spatial profile of the axial field of the magnetic resonance magnet 42 is shown at 90. It has a rising region 92, a homogeneous region 94 and decaying region 96. In the particular embodiment shown the homogenous region has a peak of 14.1 T, however the relativistic effect of the electrons in the microwave generator require 14.22 T for generating terahertz radiation to enable DNP experiments at 14.1 T, thus the auxiliary magnetic field source acts as a boost coil or boost magnet and has an axial field profile as shown at 98 with a rising portion 100, a homogenous portion 102, and a decaying portion 104. By placing the application zone indicated at vertical line 106 substantially in the homogenous zone 94 while placing the microwave generator zone indicated at vertical line 108 towards the beginning of the homogenous zone 94 proximate the rising zone 92 the resulting composite field 110 appears similar to the magnetic resonance field 90 but with a raised portion 112 in the area of the microwave generator zone 108 to provide the necessary 14.22 T. With this small but very important adjustment the microwave generator is enabled to be disposed in and powered by the magnetic field of the main magnet of the magnetic resonance system.

Figure 9A:
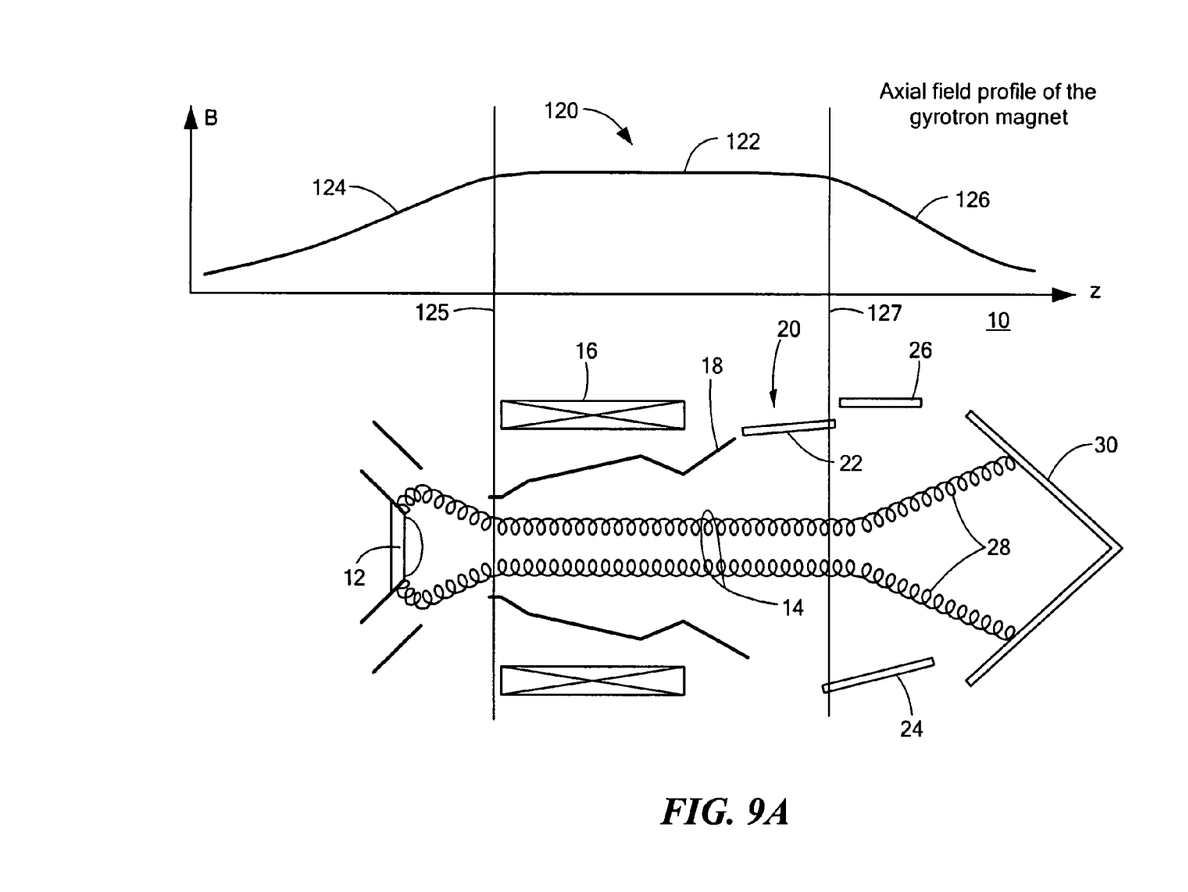
FIGS. 9A and B are a correlation of a conventional gyrotron and a gyrotron according to this invention with the axial field profile of a typical gyrotron magnet.

There is shown in FIGS. 9A and B a similar spatial distribution, axial field profile of the magnetic system coil 16 that powers the high-frequency generator 10. This profile is similar to that previously shown in the FIG. 8 but this field profile refers to the field in the high-frequency generator or gyrotron. This field 120 also has a homogenous region 122 rising portion 124 and decaying portion 126 as indicated by vertical lines 125, 127 and it is positioned as to be consistent with the spatial field in the gyrotron 10 shown below it in FIGS. 9A and 9B. There the spreading of beam 28 in the decaying portion 126 of the magnetic field is most evident resulting in the much lower power density of the beam energy when it reaches collector 30. Alternatively, in accordance with this invention VED, gyrotron, 10a is shorter and more compact because it places the collector 30a in the homogenous region 122 before the decaying region 126 where the beam 14a has begun to spread. This permits a smaller collector and a shorter overall length for the gyrotron. While the collector is shown converging to a point inwardly of the beam, this is not a necessary limitation of the invention as the opposite orientation may be used such as shown at 30aa. The reduced size of the collector is still adequate because operating in a fundamental mode the power can be decreased to, for example, 15 kV and 20 mA so that the total dissipation is 600 watts minus the 10 or 20 watts that are extracted as microwave energy. In fact, because of the operation in the fundamental mode and the resulting higher efficiency, the voltage may be dropped to 3 kV in which case the total wattage is 60 watts minus the 10 watts that are extracted as microwave energy so that collector 30a has only to dissipate 40 or 50 watts.

Figure 9B:
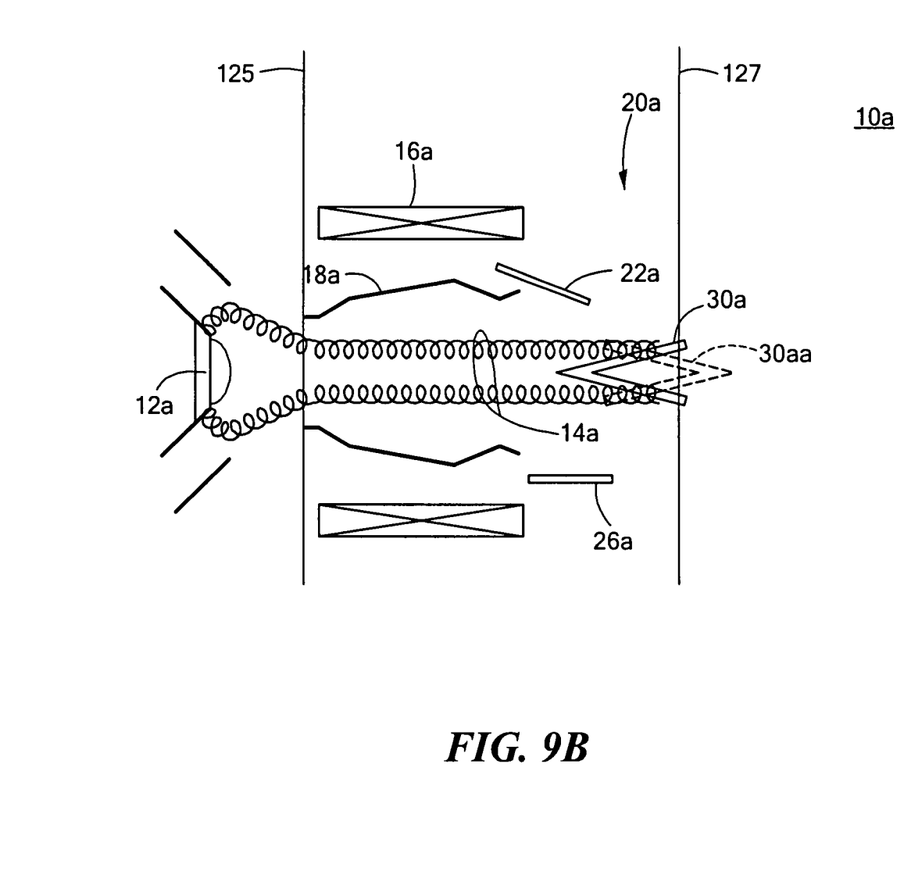

Gyrotron 10a also has reduced the size of its internal mode converter by removing one mirror 24, shifting window 26a to the other side and inclining mirror 22a to the beam direction as opposed to the generally parallel orientation of microwave mirror or reflector 22 using the conventional gyrotron VED 10.

Figure 10A:
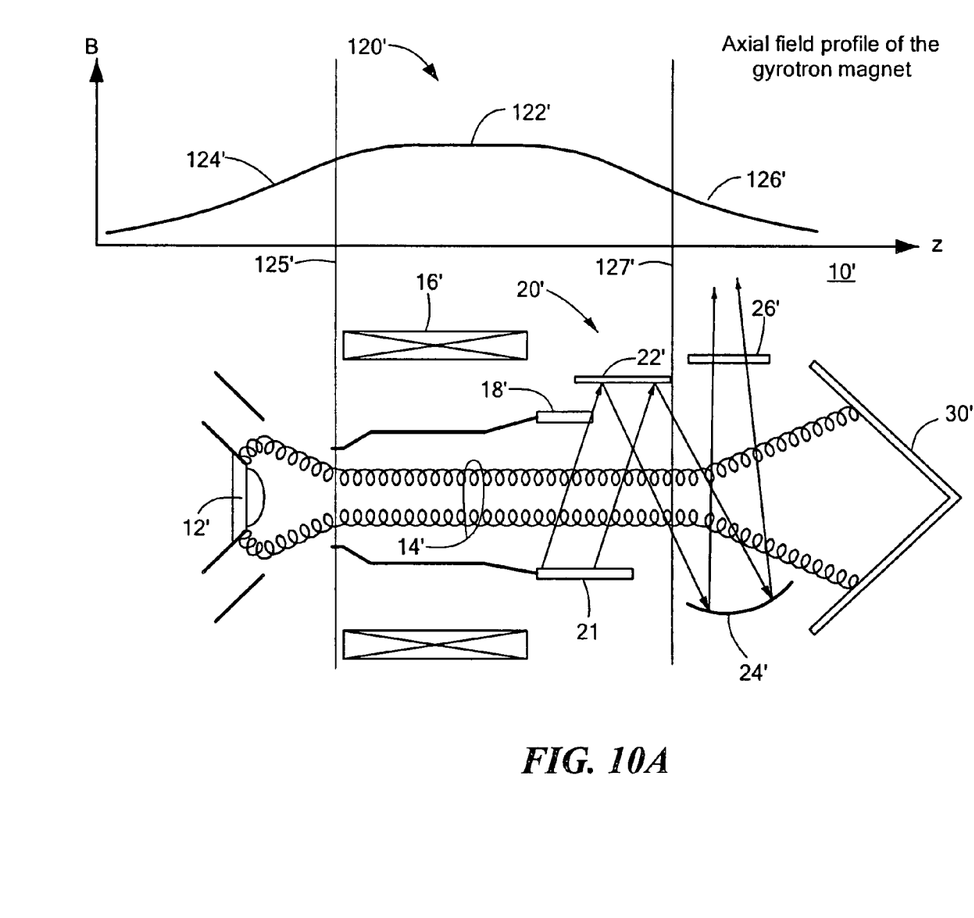
FIGS. 10A and B are views similar to FIGS. 9A & B showing the interaction structure in more detail.
Figure 10B:
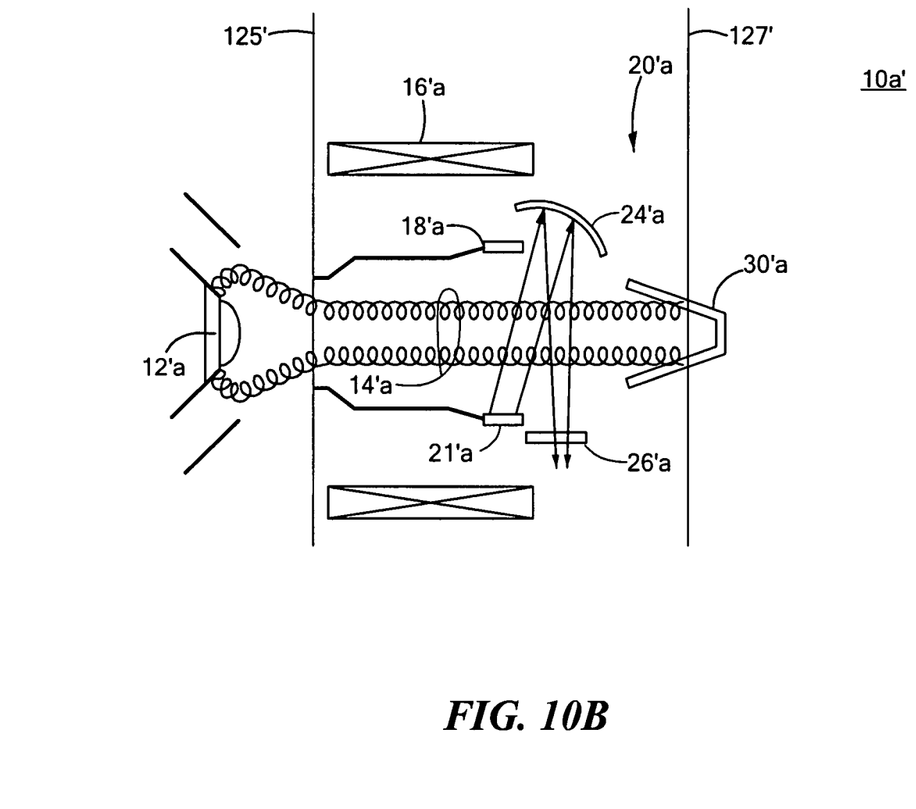

The improvement in the microwave generator outlined in FIG. 9B can be more fully appreciated with a more detailed illustration of the components of the prior art microwave generator 10', FIGS. 10A and B, and a microwave generator 10a' according to this invention. Interaction structure 18' of prior art microwave generator 10' has a waveguide launcher 21 followed by a parabolic focusing mirror 22 and one or more microwave mirrors 24' and thence out window 26'. In contrast in a microwave generator 10a' according to one embodiment of this invention the microwaves are launched from launcher 21a directly to parabolic mirror 24a, which is actually a doubly curved, profiled, inclined focusing mirror, and from there directly out window 26a'.

Figure 11:
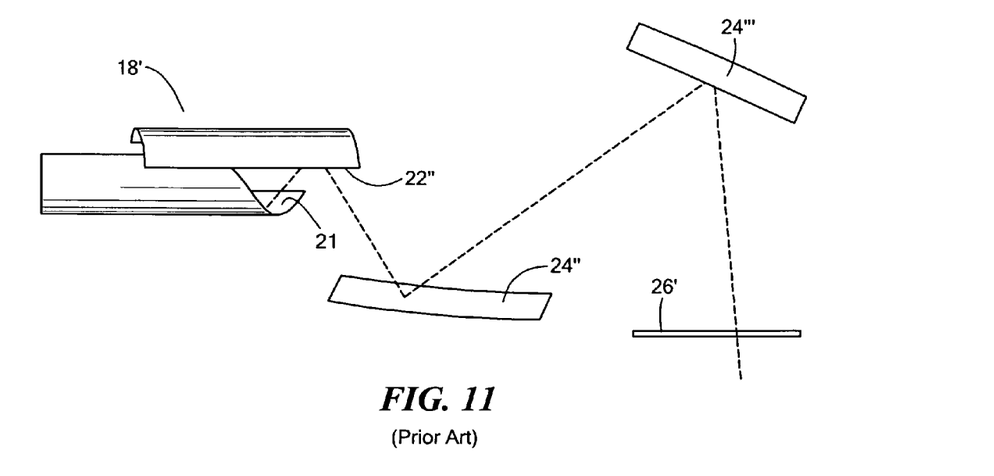
FIG. 11 is a three dimensional diagrammatic view of certain elements of the interactive structure of a prior art microwave generator.
Figure 12:
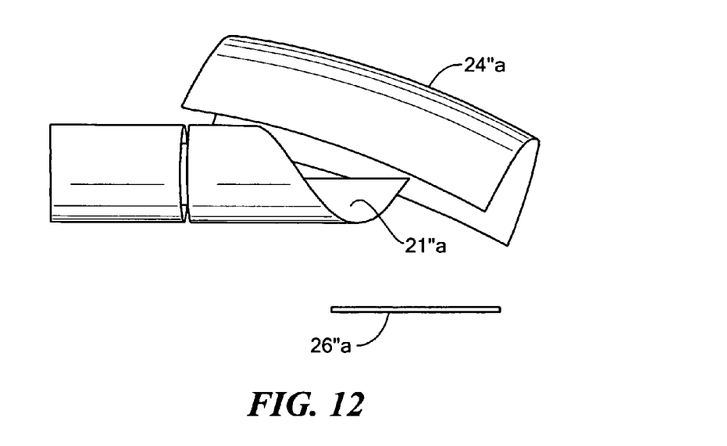
FIG. 12 is a three dimensional diagrammatic view of certain elements of the interactive structure of a microwave generator according to one embodiment of this invention.

The physical differences in internal mode converter configurations 18' and 18a' are displayed clearly in FIGS. 11 and 12, respectively. Conventional internal mode converter 18' has a helically cut waveguide launcher 21. From launcher 21 microwaves are directed to mirror 22" which is here a parabolic focusing mirror. From there microwave radiation is reflected from mirrors 24" and 24''' through window 26' In contrast in the invention embodiment shown in FIG. 12 mirror 24a" is a doubly curved, profiled inclined focusing mirror which receives microwave radiation from launcher 21a' and reflects it directly out window 26a" dramatically foreshortening the microwave generator.

Here the gyrotron can work at the fundamental cyclotron harmonic at any frequency without the need for a separate expensive superconducting magnet. Hence, we can choose a lower value of electron beam power compared to the conventional design operating at the $2^{nd}$ harmonic. Thus the electron beam density even at the interaction structure (cavity) location is sufficiently low to allow the spent beam (electron beam after terahertz generation) to be collected on a shallow cone shaped collector made of either copper, molybdenum, tungsten or other such material. In a conventional gyrotron design with many hundreds of watts to kilowatts of electron beam power, the energy density of the spent electron beam is sufficiently high to necessitate spreading the electron beam to a larger surface area in the spatially decaying magnetic field. The larger size of the beams enables collection at a water cooled collector within safe energy density level for most materials. In contrast herein collection of the electron beam happens almost right after the cavity. In this application gyrotron tube does not span the spatially decaying part of the magnetic field allowing the integration gyrotron tube with the NMR probe in the main NMR magnet.

It is clear that operation at lower voltages implies that the up-shift in the magnetic field necessary for the gyrotron to produce the correct frequency for DNP experiments is much smaller due to the lower value of the relativistic mass factor, g. Hence, the device can be operated at only 3-4 kV instead of 15 kV as in a conventional design. This choice of a lower voltage implies that the additional field necessary for the gyrotron (to be produced by the trim/buck/boost coil) is only 0.118 T instead of 0.421 T. Furthermore, due to the physics of the gyrotron interaction for a given beam power, operation at a lower voltage and higher beam current is more desirable for achieving higher efficiency. Hence, the choice of a lower voltage in this invention allows the use of a smaller auxiliary magnetic field source (trim/buck/boost coil) which is easier to incorporate inside the superconducting magnet and results in less force on the main coil and increases the efficiency of terahertz generation.

In conventional gyrotrons the internal mode converter consists of either a step-cut or a helically-cut waveguide (launcher) and two to three mirrors to convert the higher order operating mode into a free-space Gaussian like mode. This allows the extraction of the terahertz radiation out of the tube through a vacuum window. Such a mode converter spans a significant part of the region of the magnet where the magnetic field is spatially decaying. In this invention there is used an advanced internal mode converter design which is shorter. A single mirror is used to collect the radiation from the launcher and focus it on the window for extraction. Additional mirrors may be located outside the gyrotron tube to further shape the beam and direct it at the NMR sample or for injection in to a transmission line. Thus the cost of the magnet notwithstanding, the principal advantages of operating in the fundamental cyclotron harmonic are reduction in beam power, reduction in size of the tube, and simplification of design.

For performing DNP at 600 MHz, the current techniques require about 10 W of terahertz power at 395 GHz. To generate this with a 2$^{nd}$ harmonic gyrotron a typical design would require about a 15 kV, 150 mA electron beam which has total power of 2.25 kW of which only about 10 W are extracted as terahertz power and the rest of the electron beam power is dumped as heat on a massive water cooled copper collector. However, by operating in the fundamental mode, the 10 W output power can be generated with only a 15 kV, 20 mA of beam which has a total power of about 600 W. The lower beam power implies that the tube can be made significantly smaller especially the electron beam collector. With a lower beam power, the water cooling requirements are significantly reduced and even eliminated by the use of forced air cooling and thus significant cost savings can be achieved.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Furthermore, the operating frequency range indicated as the microwave or terahertz regime are to be interpreted broadly and not limited to this regime. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. An integrated high-frequency generator system utilizing the magnetic field of the target application comprising:
    a magnetic resonance magnet having an application zone and a high-frequency (microwave/terahertz) generator zone in the magnetic field of said magnetic resonance magnet; and
    a high-frequency (microwave/terahertz) generator disposed in said high-frequency (microwave/terahertz) generator zone and utilizing the magnet field of said magnetic resonance magnet to generate the high-frequency (microwave/terahertz) radiation.

2. The integrated system of claim 1 in which the high-frequency (microwave/terahertz) generator zone is in the main magnetic field of said magnetic resonance magnet.

3. The integrated system of claim 1 in which the high-frequency (microwave/terahertz) generator zone is in the fringe magnetic field of said magnetic resonance magnet.

4. The integrated system of claim 3 further including a high-frequency (microwave/terahertz) transmission line extending from said high-frequency (microwave/terahertz) generator to said application zone.

5. The integrated system of claim 1 further including an auxiliary magnetic field source for modifying the magnetic field profile in said high-frequency (microwave/terahertz) generator zone.

6. The integrated system of claim 5 in which said auxiliary magnetic field source includes a winding mounted on said high-frequency (microwave/terahertz) generator.

7. The integrated system of claim 5 in which said auxiliary magnetic field source includes a winding mounted in said magnetic resonance magnet.

8. The integrated system of claim 5 in which said auxiliary magnetic field source is comprised of at least one permanent magnet.

9. The integrated system of claim 5 in which said auxiliary magnetic field source includes a modification in said magnetic resonance magnet.

10. The integrated system of claim 9 in which said magnet resonance magnet includes at least one winding and said modification includes a variation in the amp-turns of a winding of said magnetic resonance magnet.

11. The integrated system of claim 5 in which the high-frequency (microwave/terahertz) radiation is used to perform DNP.

12. The integrated system of claim 5 in which said auxiliary magnetic field source modifies the value of said magnetic field profile in the high-frequency (microwave/terahertz) generator zone to synchronize high-frequency (microwave/terahertz) radiation from the high-frequency (microwave/terahertz) generator to enable the DNP process in the application zone.

13. The integrated system of claim 1 in which said high-frequency (microwave/terahertz) generator utilizes the magnetic field of the magnetic resonance magnet for at least one of focusing, transportation of the electron beam and interaction between the electron beam and the circuit of the VED.

14. The integrated system of claim 1 in which said magnetic resonance magnet includes a bore and said high-frequency (microwave/terahertz) generator zone is in said bore.

15. A magnetic resonance magnet device comprising:
    a magnetic resonance magnet having an application zone and a high-frequency (microwave/terahertz) generator zone in the magnetic field of the magnetic resonance magnet and an auxiliary magnetic field source in said magnetic field for modifying the magnetic field profile in the high-frequency (microwave/terahertz) generator zone.

16. The magnetic resonance magnet device of claim 15 in which the high-frequency (microwave/terahertz) generator zone is in the main magnetic field of said magnetic resonance magnet.

17. The magnetic resonance magnet device of claim 15 in which the high-frequency (microwave/terahertz) generator zone is in the fringe magnetic field of said magnetic resonance magnet.

18. The magnetic resonance magnet device of claim 17 further including a microwave transmission line extending from said microwave generator to said application zone.

19. The magnetic resonance magnet device of claim 15 in which said auxiliary magnetic field source includes a winding mounted in said magnetic resonance magnet.

20. The magnetic resonance magnet device of claim 15 in which said auxiliary magnetic field source includes a modification in said magnetic resonance magnet.

21. The magnetic resonance magnet device of claim 20 in which said magnet resonance magnet includes at least one winding and said modification includes a variation in the amp-turns of a winding of said magnetic resonance magnet.

22. The magnetic resonance magnet device of claim 15 in which the high-frequency (microwave/terahertz) radiation is used to perform DNP.

23. The magnetic resonance magnet device of claim 15 in which said auxiliary magnetic field source increases the magnitude of said magnetic field profile in the high-frequency (microwave/terahertz) generator zone to synchronize high-frequency (microwave/terahertz) radiation from the microwave generator to enable the DNP process in the application zone.

24. The magnetic resonance magnet device of claim 15 in which said microwave generator utilizes the magnetic field of the magnetic resonance magnet for at least one of focusing, transportation of the electron beam or interaction between the electron beam and the circuit of the VED.

25. The magnetic resonance magnet device of claim 15 in which said magnetic resonance magnet includes a bore and said high-frequency (microwave/terahertz) generator zone is in said bore.

\* \* \* \* \*